US010423044B2

(12) United States Patent
Franz et al.

(10) Patent No.: US 10,423,044 B2
(45) Date of Patent: Sep. 24, 2019

(54) TRANSPARENT PHOTOVOLTAIC COATING FOR AN ELECTRO-CHROMIC DEVICE

(71) Applicant: Gentex Corporation, Zeeland, MI (US)

(72) Inventors: Sue F. Franz, Holland, MI (US); William L. Tonar, Holland, MI (US); David J. Cammenga, Zeeland, MI (US); George A. Neuman, Holland, MI (US); Kurtis L. Geerlings, Zeeland, MI (US); Donald L. Bareman, Zeeland, MI (US); Kevin L. Ash, Grand Rapids, MI (US)

(73) Assignee: GENTEX CORPORATION, Zeeland, MI (US)

( * ) Notice: Subject to any disclaimer, the term of this patent is extended or adjusted under 35 U.S.C. 154(b) by 0 days.

(21) Appl. No.: 15/891,780

(22) Filed: Feb. 8, 2018

(65) Prior Publication Data

US 2018/0231861 A1 Aug. 16, 2018

Related U.S. Application Data

(60) Provisional application No. 62/457,485, filed on Feb. 10, 2017.

(51) Int. Cl.
*G02F 1/163* (2006.01)
*G02F 1/161* (2006.01)
(Continued)

(52) U.S. Cl.
CPC ............ *G02F 1/163* (2013.01); *E06B 3/6722* (2013.01); *E06B 9/24* (2013.01); *G02F 1/161* (2013.01);
(Continued)

(58) Field of Classification Search
CPC .......... G02F 1/1354; G02F 1/15; G02F 1/153; G02F 1/1533; G02F 1/155; G02F 1/161;
(Continued)

(56) References Cited

U.S. PATENT DOCUMENTS 5,377,037 A * 12/1994 Branz .................... G02C 7/101 351/45
5,384,653 A * 1/1995 Benson ................. E06B 3/6722 359/265
(Continued)

FOREIGN PATENT DOCUMENTS

WO 2013106921 A1 7/2013
WO 2013141988 A1 9/2013
WO 2015187226 A1 12/2015

OTHER PUBLICATIONS

International Searching Authority; International Search Report in PCT Application PCT/US2018/017431; dated May 24, 2018; 9 pages; Moscow, Russia.

*Primary Examiner* — Loha Ben
(74) *Attorney, Agent, or Firm* — Price Heneveld LLP; Bradley D. Johnson

(57) ABSTRACT

A transparent photovoltaic (TPV) integrated directly into the structure of an electrochromic (EC) device is beneficial in that it can eliminate at least one substrate and provide more uniform coloring. Integration of a transparent photovoltaic with an electrochromic device may also reduce or eliminate the need for an electrical bus on a substrate. In some embodiments, positioning the TPV internally with the EC cell may eliminate the need for additional substrate layers or a conductive layer on one side of the TPV cell. Integrating a PV cell into the EC device can additionally reduce the need for external wiring and an external power supply. Alterna-
(Continued)

210 270 266 262 246 248 238 242 222 218 230 234 226 254 258 250 214 tively, the TPV can assist in charging a battery where the battery can be used to power the EC device when there is no sunlight available.

20 Claims, 6 Drawing Sheets

(51) Int. Cl.

| | |
|---|---|
| ***H02J 7/35*** | (2006.01) |
| ***H02S 40/38*** | (2014.01) |
| ***H02S 40/20*** | (2014.01) |
| ***H01L 31/048*** | (2014.01) |
| ***E06B 3/67*** | (2006.01) |
| ***E06B 9/24*** | (2006.01) |
| ***H02J 7/34*** | (2006.01) |
| ***G02F 1/1514*** | (2019.01) |
| *G02F 1/153* | (2006.01) |

(52) U.S. Cl.
CPC ............ *H01L 31/0488* (2013.01); *H02J 7/35* (2013.01); *H02S 40/20* (2014.12); *H02S 40/38* (2014.12); *E06B 2009/2464* (2013.01); *E06B 2009/2476* (2013.01); *G02F 1/153* (2013.01); *G02F 2001/15145* (2019.01); *H02J 7/345* (2013.01); *Y02E 10/566* (2013.01)

(58) Field of Classification Search
CPC ........... G02F 1/163; G02F 2001/13324; G02F 2001/1502; G02F 2001/15145; H02J 7/345; H02J 7/35; H02S 20/00; H02S 40/20; H02S 40/38; B64C 1/14; Y02E 10/40; Y02E 10/50; Y02E 10/566; E06B 9/24; E06B 7/00; E06B 3/6722; E06B 2009/2464; E06B 2009/2476; H01L 31/0024; H01L 31/0488; H01L 31/05
USPC ........... 359/265, 270, 275; 345/105; 52/204, 52/591, 593, 204.595; 244/129.3
See application file for complete search history.

(56) References Cited

U.S. PATENT DOCUMENTS

| | | | | |
|---|---|---|---|---|
| 5,805,330 | A * | 9/1998 | Byker | G02F 1/13318 359/265 |
| 6,045,643 | A * | 4/2000 | Byker | G02F 1/13318 156/102 |
| 6,055,089 | A * | 4/2000 | Schulz | G02F 1/163 136/251 |
| 6,407,847 | B1 | 6/2002 | Poll et al. | |
| 6,433,913 | B1 * | 8/2002 | Bauer | G02C 7/101 156/107 |
| 6,594,065 | B2 | 7/2003 | Byker et al. | |
| 8,632,034 | B2 * | 1/2014 | Mitchell | B60J 3/04 244/129.3 |
| 9,618,820 | B2 * | 4/2017 | Conklin | G02F 1/163 |
| 2014/0036337 | A1 | 2/2014 | Neuman et al. | |

* cited by examiner

TRANSPARENT PHOTOVOLTAIC COATING FOR AN ELECTRO-CHROMIC DEVICE

CROSS-REFERENCE TO RELATED APPLICATION

This application claims priority under 35 U.S.C. § 119(e) to U.S. Provisional Application No. 62/457,485, filed on Feb. 10, 2017, entitled "TRANSPARENT PHOTOVOLTAIC COATING FOR AN ELECTRO-CHROMIC DEVICE," the disclosure of which is hereby incorporated herein by reference in its entirety.

TECHNICAL FIELD

The present device generally relates to an electro-optic device, and more particularly, to an electro-optic device having transparent photovoltaic materials integrated with the structure and electronics of an electrochromic cell.

BACKGROUND OF THE DISCLOSURE

Electro-optic assemblies are being used in various vehicular and building applications, e.g., within rearview display devices and variably transmissive windows. Use of these assemblies in various applications can be limited by cost, aesthetic, and functional considerations. Accordingly, new electro-optic assembly designs, configurations, and assemblies, along with methods of making them, are needed particularly in view of reducing material and processing costs, improving aesthetics, and/or enhancing functionality.

SUMMARY OF THE DISCLOSURE

According to one aspect of the present disclosure, an electro-optic device is provided. The electro-optic device includes a first substantially transparent substrate having first and second surfaces disposed on opposite sides thereof, wherein the second surface comprises a first electrically conductive layer, a second substantially transparent substrate having third and fourth surfaces disposed on opposite sides thereof, wherein the fourth surface comprises a third electrically conductive layer, and a third substantially transparent substrate having fifth and sixth surfaces disposed on opposite sides thereof, wherein the fifth surface comprises a fourth electrically conductive layer. The electro-optic device further includes a primary seal disposed between the second and third substantially transparent substrates, wherein the seal and the second and third substantially transparent substrates define a cavity therebetween, a lamination material disposed between the third surface of the second substantially transparent substrate and a second electrically conductive layer, an electro-optic medium disposed in the cavity, the electro-optic medium being variably transmissive such that the electro-optic device is operable between substantially clear and darkened states, and a transparent photovoltaic medium disposed between the first and second electrically conductive layers, wherein the transparent photovoltaic medium converts and maintains the electro-optic device in the darkened state.

According to another aspect of the present disclosure, an electro-optic device is provided. The electro-optic device includes a first substantially transparent substrate having first and second surfaces disposed on opposite sides thereof, wherein the second surface comprises a first electrically conductive layer, a second substantially transparent substrate having third and fourth surfaces disposed on opposite sides thereof, wherein the third surface comprises a third electrically conductive layer, and a primary seal disposed between the first and second substantially transparent substrates, wherein the seal and the first and second substantially transparent substrates define a cavity therebetween. The electro-optic device further includes an electro-optic medium disposed in the cavity on the third surface of the second substantially transparent substrate, the electro-optic medium being variably transmissive such that the electro-optic device is operable between substantially clear and darkened states, a transparent photovoltaic medium disposed in the cavity on the first electrically conductive layer, wherein the transparent photovoltaic medium converts and maintains the electro-optic device to the darkened state, and a second electrically conductive layer disposed between the electro-optic medium and the transparent photovoltaic medium.

According to another aspect of the present disclosure, an electro-optic device is provided. The electro-optic device includes a first substantially transparent substrate having first and second surfaces disposed on opposite sides thereof, wherein the second surface comprises a first electrically conductive layer, a second substantially transparent substrate having third and fourth surfaces disposed on opposite sides thereof, wherein the third surface comprises a second electrically conductive layer, and a primary seal disposed between the first and second substantially transparent substrates, wherein the seal and the first and second substantially transparent substrates define a cavity therebetween. The electro-optic device further includes a first transparent photovoltaic medium disposed in the cavity on the second surface of the first substantially transparent substrate, a second transparent photovoltaic medium disposed in the cavity on the third surface of the second substantially transparent substrate, and an electro-optic medium disposed in the cavity between the first and second transparent photovoltaic mediums, the electro-optic medium being variably transmissive such that the electro-optic device is operable between substantially clear and darkened states.

According to yet another aspect of the present disclosure, an electro-optic device is provided. The electro-optic device includes a first substantially transparent substrate having first and second surfaces disposed on opposite sides thereof, wherein the second surface comprises a first electrically conductive layer, a second substantially transparent substrate having third and fourth surfaces disposed on opposite sides thereof, wherein the third surface comprises a second electrically conductive layer, and a primary seal disposed between the first and second substantially transparent substrates, wherein the seal and the first and second substantially transparent substrates define a cavity therebetween. The electro-optic device further includes a first transparent photovoltaic medium disposed in the cavity on the first electrically conductive layer, a second transparent photovoltaic medium disposed in the cavity on the second electrically conductive layer, an electro-optic medium disposed in the cavity between the first and second transparent photovoltaic mediums, the electro-optic medium being variably transmissive such that the electro-optic device is operable between substantially clear and darkened states, and a plurality of spacer materials disposed in the cavity extending from the first electrically conductive layer to the second electrically conductive layer traversing the electro-optic medium and the first and second transparent photovoltaic mediums.

According to still another aspect of the present disclosure, an electro-optic device is provided. The electro-optic device includes a first substantially transparent substrate having first and second surfaces disposed on opposite sides thereof, wherein the second surface comprises a first electrically conductive layer, a second substantially transparent substrate having third and fourth surfaces disposed on opposite sides thereof, wherein the third surface comprises a second electrically conductive layer, and a primary seal disposed between the first and second substantially transparent substrates, wherein the seal and the first and second substantially transparent substrates define a cavity therebetween. The electro-optic device further includes an electro-optic medium disposed in the cavity on the second electrically conductive layer, the electro-optic medium being variably transmissive such that the electro-optic device is operable between substantially clear and darkened states, and a transparent photovoltaic medium disposed in the cavity on the first electrically conductive layer, wherein the transparent photovoltaic medium converts and maintains the electro-optic device to the darkened state, wherein the transparent photovoltaic medium is additionally disposed on the electro-optic medium.

According to yet another aspect of the present disclosure, an electro-optic device is provided. The electro-optic device includes a first substantially transparent substrate having first and second surfaces disposed on opposite sides thereof, wherein the first surface comprises a second electrically conductive layer and the second surface comprises a third electrically conductive layer, a second substantially transparent substrate having third and fourth surfaces disposed on opposite sides thereof, wherein the third surface comprises a fourth electrically conductive layer, and a primary seal disposed between the first and second substantially transparent substrates, wherein the seal and the first and second substantially transparent substrates define a cavity therebetween. The electro-optic device further includes an electro-optic medium disposed in the cavity, the electro-optic medium being variably transmissive such that the electro-optic device is operable between substantially clear and darkened states and a transparent photovoltaic medium disposed between a first electrically conductive layer and the second electrically conductive layer of the first substantially transparent substrate, wherein the transparent photovoltaic medium converts and maintains the electro-optic device to the darkened state.

These and other features, advantages, and objects of the present device will be further understood and appreciated by those skilled in the art upon studying the following specification, claims, and appended drawings.

DETAILED DESCRIPTION OF EMBODIMENTS

Figure 1:
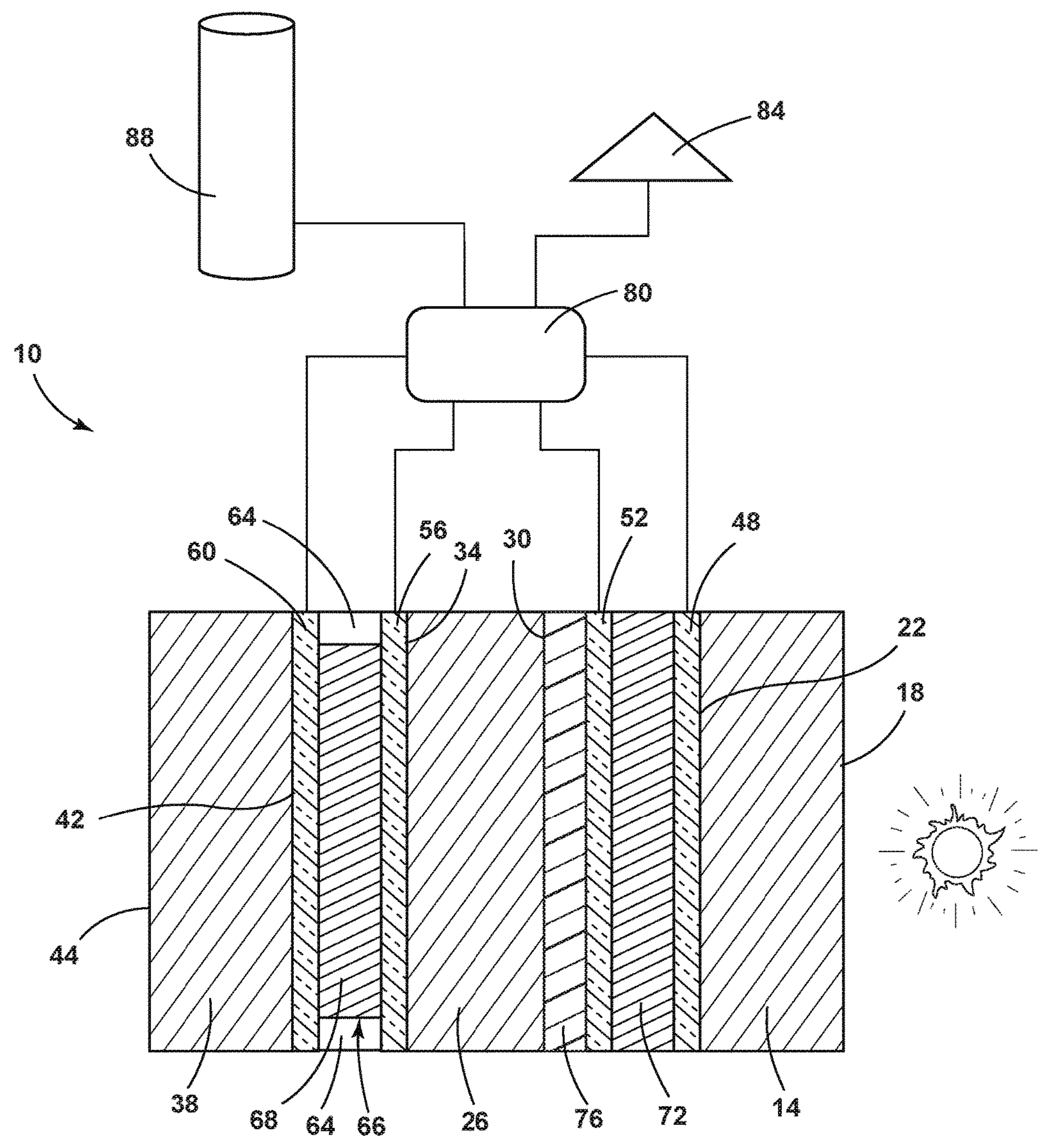
FIG. 1 is a schematic view of an electro-optic device in accordance with one aspect of the present disclosure.

The present illustrated embodiments reside primarily in combinations of method steps and apparatus components related to an electro-optic device. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Integrating a transparent photovoltaic (TPV) directly into the structure of an electrochromic (EC) device is beneficial in that it can eliminate at least one substrate and provide more uniform coloring. Integration of a transparent photovoltaic with an electrochromic device may also reduce or eliminate the need for an electrical bus on a substrate. In some embodiments, positioning the TPV internally with the EC cell may eliminate the need for additional substrate layers or a conductive layer on one side of the TPV cell. Integrating a TPV cell into the EC device may also reduce the need for external wiring and an external power supply. Alternatively, the TPV can assist in charging an energy storage device or battery where the energy storage device can be used to power the EC device when there is no sunlight available.

The level of transmission in transparent photovoltaics may vary, but in some embodiments, a TPV layer integrated in a photovoltaic device may have at least 60%, at least 50%, at least 45%, at least 40%, or at least 30% transmission in the visible spectrum. There are several ways to combine a transparent PV with an electro-optic device and/or window.

Referring to FIG. 1, an electro-optic device 10 includes a first substantially transparent substrate 14 having first and second surfaces 18, 22 disposed on opposite sides thereof, wherein the second surface 22 comprises a first electrically conductive layer 48, a second substantially transparent substrate 26 having third and fourth surfaces 30, 34 disposed on opposite sides thereof, wherein the fourth surface 34 comprises a third electrically conductive layer 56, and a third substantially transparent substrate 38 having fifth and sixth surfaces 42, 44 disposed on opposite sides thereof, wherein the fifth surface 42 comprises a fourth electrically conductive layer 60. The electro-optic device 10 further includes a primary seal 64 disposed between the second and third substantially transparent substrates 26, 38, wherein the seal 64 and the second and third substantially transparent substrates 26, 38 define a cavity 66 therebetween, a lamination material 76 disposed between the third surface 30 of the second substantially transparent substrate 26 and a second electrically conductive layer 52, an electro-optic medium 68 disposed in the cavity 66, the electro-optic medium 68 being variably transmissive such that the electro-optic device 10 is operable between substantially clear and darkened states, and a transparent photovoltaic medium 72 disposed between the first and second electrically conductive layers 48, 52, wherein the transparent photovoltaic medium 72 converts and maintains the electro-optic device 10 in the darkened state.

A solar cell or photovoltaic cell, as described in FIG. 1, includes the transparent photovoltaic medium 72 and the coupled first and second electrically conductive layers 48, 52 wherein an electrochromic cell includes the electro-optic medium 68 positioned in the cavity 66 that is coupled to the third and fourth electrically conductive layers 56, 60. FIG. 1 depicts the transparent photovoltaic medium 72 external to the electro-optic medium 68 device where the two mediums 68, 72 and their respective electrically conductive layers 48, 52, 56, 60 do not share substantially transparent substrates 14, 26, 38. The solar cell may then be laminated to the electrochromic cell and wires may be run from the transparent photovoltaic medium 72 to the electro-optic medium 68 to power the electro-optic device 10. In this configuration, the electro-optic device 10 may also have an external power supply 88 to power the electro-optic device 10 when no light is available. In some aspects, the transparent photovoltaic medium 72 may be configured to electrically charge the external power supply 88.

In some embodiments, a controller 80 is configured to determine when the power provided by the transparent photovoltaic medium 72 is sufficient to darken the electro-optic medium 68. In additional embodiments, one or more inputs 84 including, for example, optical sensors, temperature sensors, etc., may be in communication with the controller 80. The controller 80 receives input/information from the one or more inputs 84 and is configured to determine whether the power sources used to provide a voltage to the electro-optic medium 68 should be provided from the transparent photovoltaic medium 72 and/or the external power supply 88. The external power supply 88 includes, but is not limited to, a capacitor, a super capacitor, and/or a rechargeable battery. The external power supply 88 is electrically coupled to the controller 80 and the one or more inputs 84, and is configured to power the same. It should be appreciated that more than one external power supply 88 may be implemented in the electro-optic device 10. The external power supply 88 is configured to store and/or deliver an electrical charge when the electro-optic device 10 is not absorbing the threshold light energy.

Figure 2:
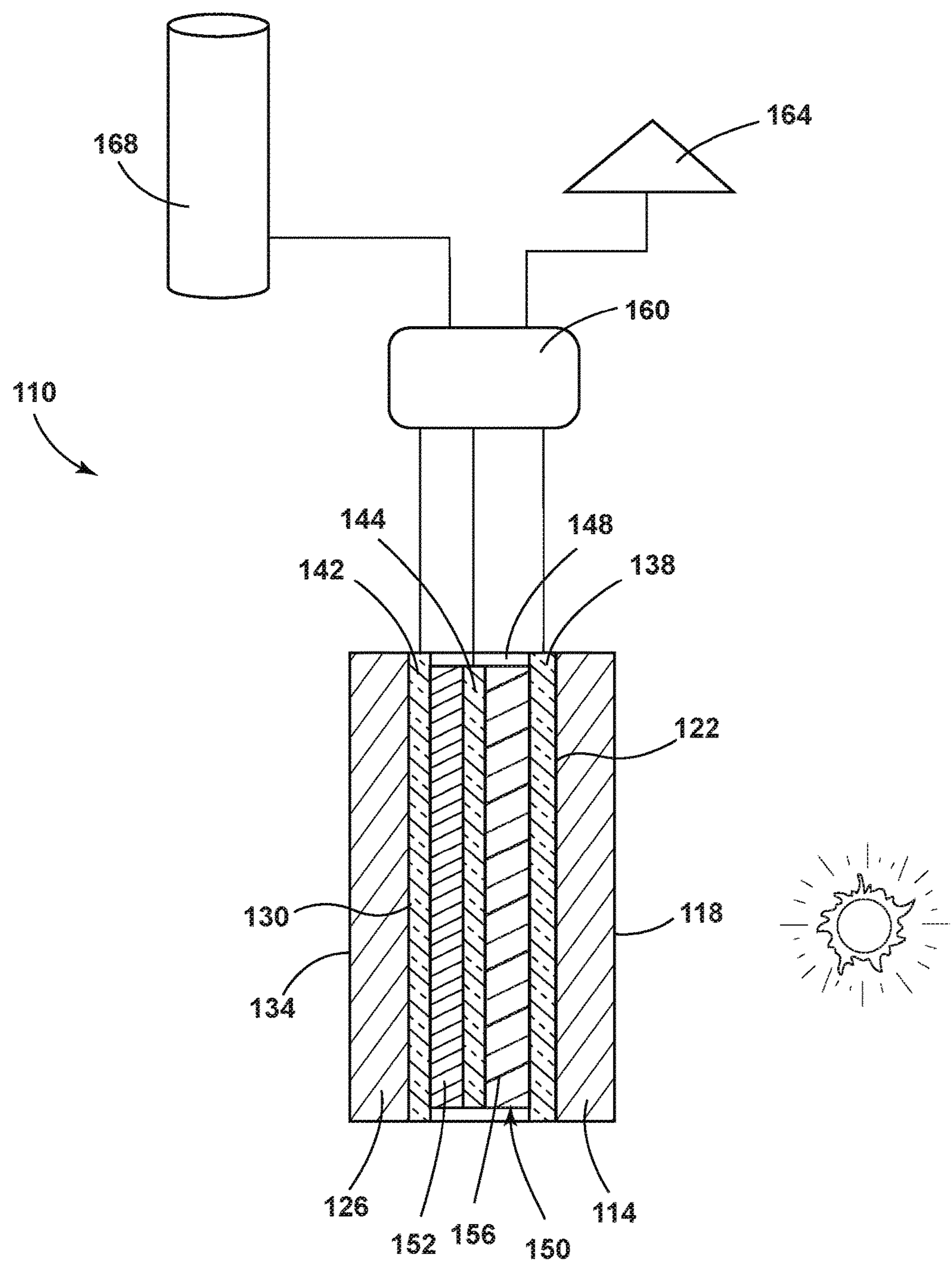
FIG. 2 is a schematic view of an electro-optic device in accordance with another aspect of the present disclosure.

Referring now to FIG. 2, an electro-optic device 110 includes a first substantially transparent substrate 114 having first and second surfaces 118, 122 disposed on opposite sides thereof, wherein the second surface 122 comprises a first electrically conductive layer 138, a second substantially transparent substrate 126 having third and fourth surfaces 130, 134 disposed on opposite sides thereof, wherein the third surface 130 comprises a third electrically conductive layer 142, and a primary seal 148 disposed between the first and second substantially transparent substrates 114, 126, wherein the seal 148 and the first and second substantially transparent substrates 114, 126 define a cavity 150 therebetween. The electro-optic device 110 further includes an electro-optic medium 152 disposed in the cavity 150 on the third surface 130 of the second substantially transparent substrate 126, the electro-optic medium 152 being variably transmissive such that the electro-optic device 110 is operable between substantially clear and darkened states, a transparent photovoltaic medium 156 is disposed in the cavity 150 on the first electrically conductive layer 138, wherein the transparent photovoltaic medium 156 converts and maintains the electro-optic device 110 to the darkened state, and a second electrically conductive layer 144 disposed between the electro-optic medium 152 and the transparent photovoltaic medium 156.

A solar cell or photovoltaic cell, as described in FIG. 2, includes the transparent photovoltaic medium 156 and the coupled first and second electrically conductive layers 138, 144 wherein an electrochromic cell includes the electro-optic medium 152 positioned in the cavity 150 that is coupled to the second and third electrically conductive layers 144, 142. FIG. 2 depicts the electro-optic device 110 with the transparent photovoltaic medium 156 positioned internally with the electro-optic medium 152. The transparent photovoltaic medium 156 may be coupled to the second electrically conductive layer 144 where the second electrically conductive layer 144 is additionally coupled to the electro-optic medium 152 of the electro-optic device 110. In this configuration, the electro-optic device 110 may also have an external power supply 168 to power the electro-optic device 110 when no light is available. In some aspects, the transparent photovoltaic medium 156 may be configured to electrically charge the external power supply 168.

In some embodiments, a controller 160 is configured to determine when power provided by the transparent photovoltaic medium 156 is sufficient to darken the electro-optic medium 152. In additional embodiments, one or more inputs 164 including, for example, optical sensors, temperature sensors, etc., may be in communication with the controller 160. The controller 160 receives input/information from the one or more inputs 164 and is configured to determine whether the power sources used to provide a voltage to the electro-optic medium 152 should be provided from the transparent photovoltaic medium 156 and/or the external power supply 168. The external power supply 168 includes, but is not limited to, a capacitor, a super capacitor, and/or a rechargeable battery. The external power supply 168 is electrically coupled to the controller 160 and the one or more inputs 164, and is configured to power the same. It should be appreciated that more than one external power supply 168 may be implemented in the electro-optic device 110. The external power supply 168 is configured to store and/or deliver an electrical charge when the electro-optic device 110 is not absorbing the threshold light energy.

Figure 3:
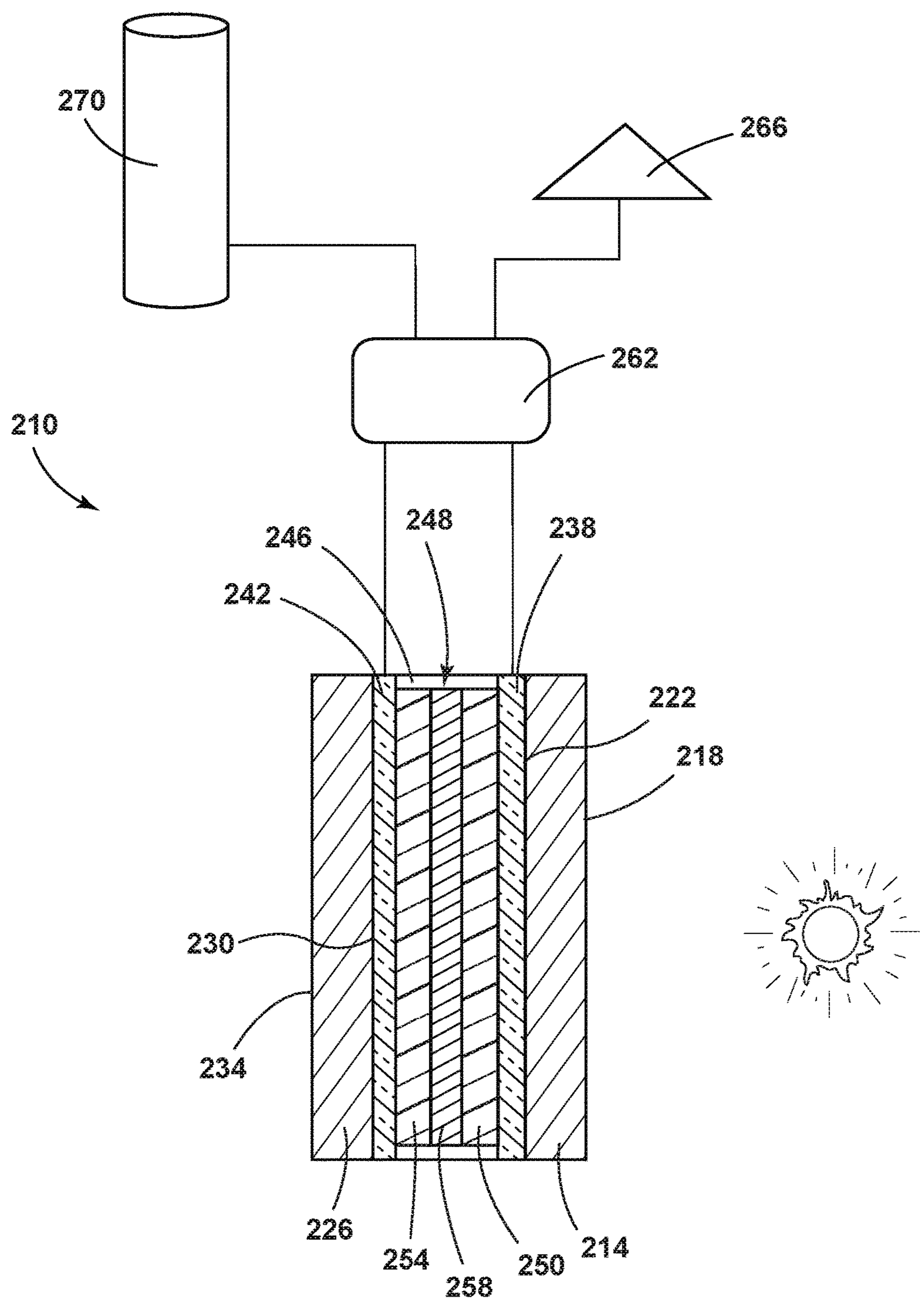
FIG. 3 is a schematic view of an electro-optic device in accordance with another aspect of the present disclosure.

Referring now to FIG. 3, an electro-optic device 210 includes a first substantially transparent substrate 214 having first and second surfaces 218, 222 disposed on opposite sides thereof, wherein the second surface 222 comprises a first electrically conductive layer 238, a second substantially transparent substrate 226 having third and fourth surfaces 230, 234 disposed on opposite sides thereof, wherein the third surface 230 comprises a second electrically conductive layer 242, and a primary seal 246 disposed between the first and second substantially transparent substrates 214, 226, wherein the seal 246 and the first and second substantially transparent substrates 214, 226 define a cavity 248 therebetween. The electro-optic device 210 further includes a first transparent photovoltaic medium 250 disposed in the cavity 248 on the second surface 222 of the first substantially transparent substrate 214, a second transparent photovoltaic medium 254 disposed in the cavity 248 on the third surface 230 of the second substantially transparent substrate 226, and an electro-optic medium 258 disposed in the cavity 248 between the first and second transparent photovoltaic mediums 250, 254, the electro-optic medium 258 being variably transmissive such that the electro-optic device 210 is operable between substantially clear and darkened states.

As further described in FIG. 3, the electro-optic device 210 combines the electro-optic medium 258 with two transparent photovoltaic mediums 250, 254. The first transparent photovoltaic medium 250 includes a donor material on one side of the electro-optic medium 258. The second transparent photovoltaic medium 254 includes an acceptor material on the opposite side of the electro-optic medium 258. The first and second transparent photovoltaic mediums 250, 254 may have first and second electrically conductive layers 238, 242 such as indium tin oxide (ITO) coupled between the active first and second transparent photovoltaic mediums 250, 254 and the first and second electrically conductive layers 238, 242 and the first and second transparent photovoltaic mediums 250, 254 may be in direct contact with the electro-optic medium 258. In some embodiments, darkening the electro-optic device 210 by using an electrical connection between the two electrically conductive layers 238, 242 is required. If the electrical connection is broken between the two electrically conductive layers 238, 242, the electro-optic device 210 will not darken.

With this configuration, the electro-optic device and/or window will darken in each location based on the solar energy being received in each location. Edge to center coloring (irising) effects may still be present based on the conductivity of the first and second electrically conductive layers 238, 242. Using this first and second transparent photovoltaic medium 250, 254 construction, it is important that a sufficient transmission of charge or electrons is transferred through the first transparent photovoltaic medium 250 and through the electro-optic medium 258 to allow the second transparent photovoltaic medium 254 to function. Having the electro-optic medium 258 provide a high transmission of light in the near IR is important for proper function of the electro-optic device 210. In this configuration, the electro-optic device 210 may also have an external power supply 270 to power the electro-optic device 210 when no light is available. In some aspects, the transparent photovoltaic medium 254 may be configured to electrically charge the external power supply 270.

In some embodiments, a controller 262 is configured to determine when power provided by the first and second transparent photovoltaic mediums 250, 254 is sufficient to darken the electro-optic medium 258. In additional embodiments, one or more inputs 266 including, for example, optical sensors, temperature sensors, etc., may be in communication with the controller 262. The controller 262 receives input/information from the one or more inputs 266 and is configured to determine whether the power sources used to provide a voltage to the electro-optic medium 258 should be provided from the first and second transparent photovoltaic mediums 250, 254 and/or the external power supply 270. The external power supply 270 includes, but is not limited to, a capacitor, a super capacitor, and/or a rechargeable battery. The external power supply 270 is electrically coupled to the controller 262 and the one or more inputs 266, and is configured to power the same. It should be appreciated that more than one external power supply 270 may be implemented in the electro-optic device 210. The external power supply 270 is configured to store and/or deliver an electrical charge when the electro-optic device 210 is not absorbing the threshold light energy.

Still referring to FIG. 3, if the electro-optic medium 258 requires a greater electrical potential than the first transparent photovoltaic medium 250 provides, the second transparent photovoltaic mediums 254 may be added to the system as shown. The electrical potential across the electro-optic medium 258 may be as high as the sum of the electrical potentials of the first and second transparent photovoltaic mediums 250, 254. In other embodiments, increasing the electrical potential seen by the electro-optic medium 258 could be achieved by incorporating multiple cells where the cells may be positioned outside of the EC cell.

Figure 4:
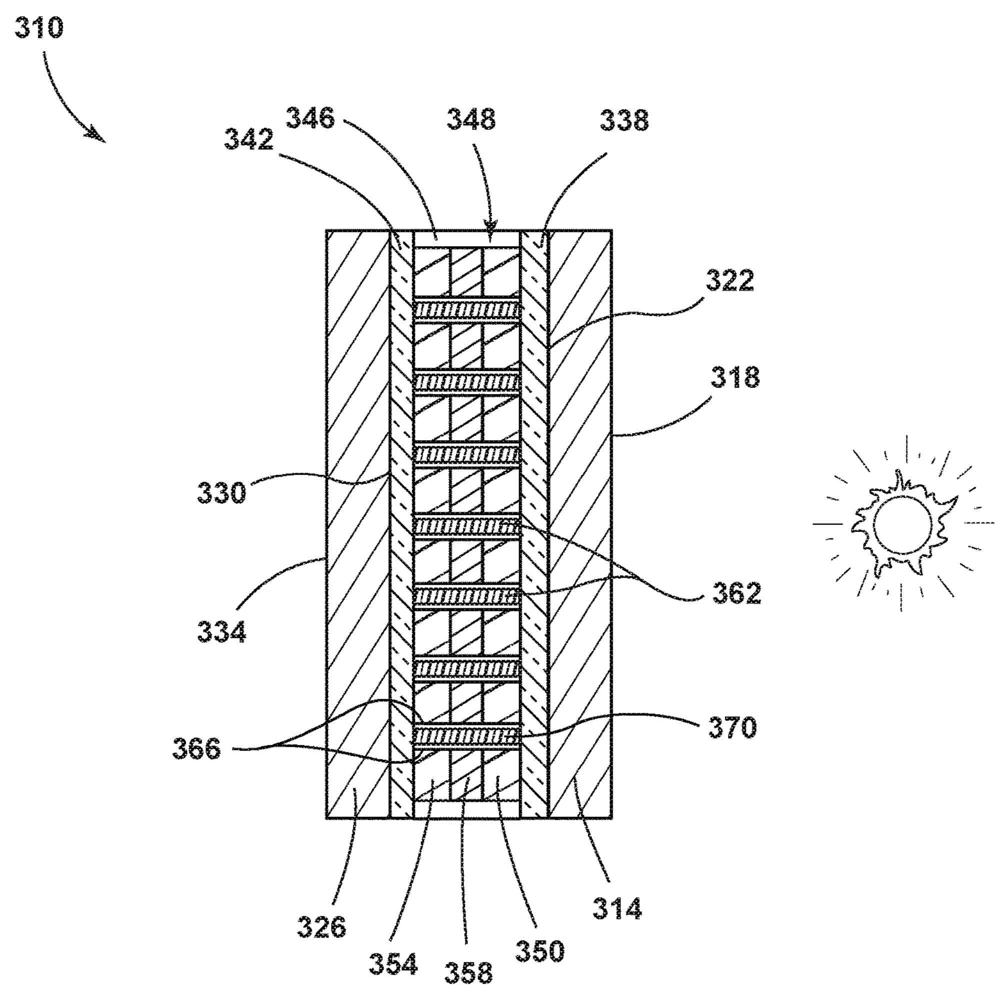
FIG. 4 is a schematic view of an electro-optic device in accordance with another aspect of the present disclosure.

Referring now to FIG. 4, an electro-optic device 310 includes a first substantially transparent substrate 314 having first and second surfaces 318, 322 disposed on opposite sides thereof, wherein the second surface 322 comprises a first electrically conductive layer 338, a second substantially transparent substrate 326 having third and fourth surfaces 330, 334 disposed on opposite sides thereof, wherein the third surface 330 comprises a second electrically conductive layer 342, and a primary seal 346 disposed between the first and second substantially transparent substrates 314, 326, wherein the seal 346 and the first and second substantially transparent substrates 314, 326 define a cavity 348 therebetween. The electro-optic device 310 further includes a first transparent photovoltaic medium 350 disposed in the cavity 348 on the first electrically conductive layer 338, a second transparent photovoltaic medium 354 disposed in the cavity 348 on the second electrically conductive layer 342, an electro-optic medium 358 disposed in the cavity 348 between the first and second transparent photovoltaic mediums 350, 354, the electro-optic medium 358 being variably transmissive such that the electro-optic device 310 is operable between substantially clear and darkened states, and a plurality of insulated electrical connections 362 disposed in the cavity 348 extending from and electrically connecting the first electrically conductive layer 338 to the second electrically conductive layer 342 traversing the electro-optic medium 358 and the first and second transparent photovoltaic mediums 350, 354. Each of the insulated electrical connections 362 includes an insulating portion 366 surrounding a conductive core 370. The insulating portion 366 insulates the conductive core 370 from the electro-optic medium 358 and the first and second transparent photovoltaic mediums 350, 354 so no electrical contact is made between these respective regions.

As described in FIG. 4, the electro-optic device 310 combines the electro-optic medium 358 with two transparent photovoltaic mediums 350, 354. The first transparent photovoltaic medium 350 includes a donor region and an acceptor region where the first transparent photovoltaic medium 350 is positioned on one side of the electro-optic medium 358. The second transparent photovoltaic medium 354 also includes a donor region and an acceptor region where the second transparent photovoltaic medium 354 is positioned on the opposite side of the electro-optic medium 358. The first and second transparent photovoltaic mediums 350, 354 may have transparent electrically conductive layers 338, 342, for example, indium tin oxide (ITO) coupled between the active first and second transparent photovoltaic mediums 350, 354 and the first and second substrates 314, 326. The first and second transparent photovoltaic mediums 350, 354 may be in direct contact with the electro-optic medium 358. In some embodiments, the electro-optic medium 358 is sandwiched between the donor region of the first transparent photovoltaic medium 350 and the acceptor region of second transparent photovoltaic medium 354, while in other embodiments, the electro-optic medium 358 is sandwiched between the acceptor region of the first transparent photovoltaic medium 350 and the donor region of second transparent photovoltaic medium 354. In additional embodiments, darkening the electro-optic device 310 by using an electrical connection between the two electrically conductive layers 338, 342 is required. If the electrical connection is broken between the two electrically conductive layers 338, 342, the electro-optic device 310 will not darken.

Relative to the electro-optic device 210 presented in FIG. 3, where the electro-optic device 210 may darken in each location based on the solar energy being received in each location. Edge to center coloring (irising) effects may arise or be present based on the conductivity of the electrically conductive layers 238, 242. To address these potential coloring or irising effects, the use of first and second transparent photovoltaic medium 350, 354 with the plurality of insulated electrical connections 362 to form a plurality of cells may provide sufficient transmission of charge or electrons to be transferred through the first transparent photovoltaic medium 350 and through the electro-optic medium 358 to allow the second transparent photovoltaic medium 354 to function. Having the electro-optic medium 358 provide a high transmission of light in the near IR is important for proper function of the electro-optic device 310.

In some embodiments represented in FIG. 4, the electro-optic device 310 may be fabricated or used with no external wiring. The two electrically conductive layers 338, 342 may be electrically connected at various locations in the electro-optic device 310. The electrical vias may pass through the electro-optic medium 358 and through the active layers of the first transparent photovoltaic medium 350 without making electrical contact to these surfaces. The electrical connections can reduce the drop in electrical potential that results from current flow through the resistive electrically conductive layers 338, 342. The connections may be distributed through the area of the device as shown in FIG. 4 and may be formed as lines or as individual columns. The electrically conductive layers 338, 342 may be insulated from the electro-optic medium 358 and from the first and second transparent photovoltaic mediums 350, 354. In some embodiments, a conductive bead surrounded by a non-conducting epoxy may be used as the insulated electrical connection 362.

Referring again to the embodiment of FIG. 4, the plurality of insulated electrical connections 362 may be disposed in the cavity 348 to maintain an approximately equal cell spacing between the first substantially transparent substrate 314 and the second substantially transparent substrate 326 within the electro-optic device 310. In the assembly and manufacture of electro-optics devices, the plurality of insulated electrical connections 362 may include insulated beads that may be disposed in the cavity 348 by affixing the insulated beads to either the second or third surfaces 322, 330 of either the first or second substantially transparent substrates 314, 326. In some embodiments, the plurality of insulated electrical connections 362 may be a plurality of conductive beads surrounded by a non-conducting epoxy. The insulated beads may be positioned to temporarily maintain proper cell spacing of the cavity 348 during the manufacturing process prior to and during curing of the primary seal 348. In some embodiments, and as shown in FIG. 4, the insulated beads are positioned and coupled between the second and third surfaces 322, 330 to physically separate the first and second substantially transparent substrates 314, 326 thereby setting the cell spacing of the cavity 348 as the largest dimension of the insulated beads. The insulated beads are particularly useful in the manufacture of electro-optic devices having large or thin substrates, as the insulated beads help prevent distortion and double image during device manufacture given the structural rigidity of the insulated beads. This rigidity maintains a uniform cell spacing between the first and second substantially transparent substrates 314, 326 until gelation of the electro-optic medium 358 occurs. The use of insulated beads is also advantageous from a cost savings standpoint, as the insulated beads are a cost effective way to maintain cell spacing without the use of highly specialized equipment.

The cavity 348 of the electro-optic device 310 can be configured to have an approximately 0.5 millimeter cell spacing, or spacing between the first substantially transparent substrate 314 and the second substantially transparent substrate 326, according to at least one embodiment. In such an embodiment, the insulated beads are configured to be approximately 0.5 millimeters in height and/or diameter. Generally, the insulated beads are used to maintain cell spacing for a relatively short period of time during the manufacture of an electro-optic device. Thus, the insulated beads should have a diameter or largest dimension equal to or slightly greater than a desired cell spacing for the electro-optic device 310. Selection of properly sized insulated beads can be accomplished by sieving through successive screens to obtain a desired size. The diameter of the insulated beads may be about 100 microns to about 2000 microns, and more desirably, between about 250 microns to about 1000 microns. By way of explanation and not limitation, the insulated beads may be in a column or pillar orientation as shown in FIG. 4, or the insulated beads may also have a substantially round or spherical orientation. It will be understood by one having ordinary skill in the art that the insulated beads described throughout this disclosure can be replaced by any form of spacing member having a configuration that is not substantially spherical, but may be substantially cubic, conical, cylindrical, rectangular, pyramid shaped, randomly formed by a printing technique, or any other configuration appropriate to maintain the cell spacing.

The insulated beads can be approximately uniform in color. In some embodiments, the insulated beads may be substantially dark and consistent with the color of the electro-optic device 310 in the darkened state. The insulated beads may also be substantially opaque, such that when the electro-optic device 310 is in the darkened state, the insulated beads do not result in points of high transmissivity of light. Thus, when the insulated beads are opaque, the electro-optic device 310 maintains a substantially uniform level of transmissivity of light while in the darkened state.

Figure 5:
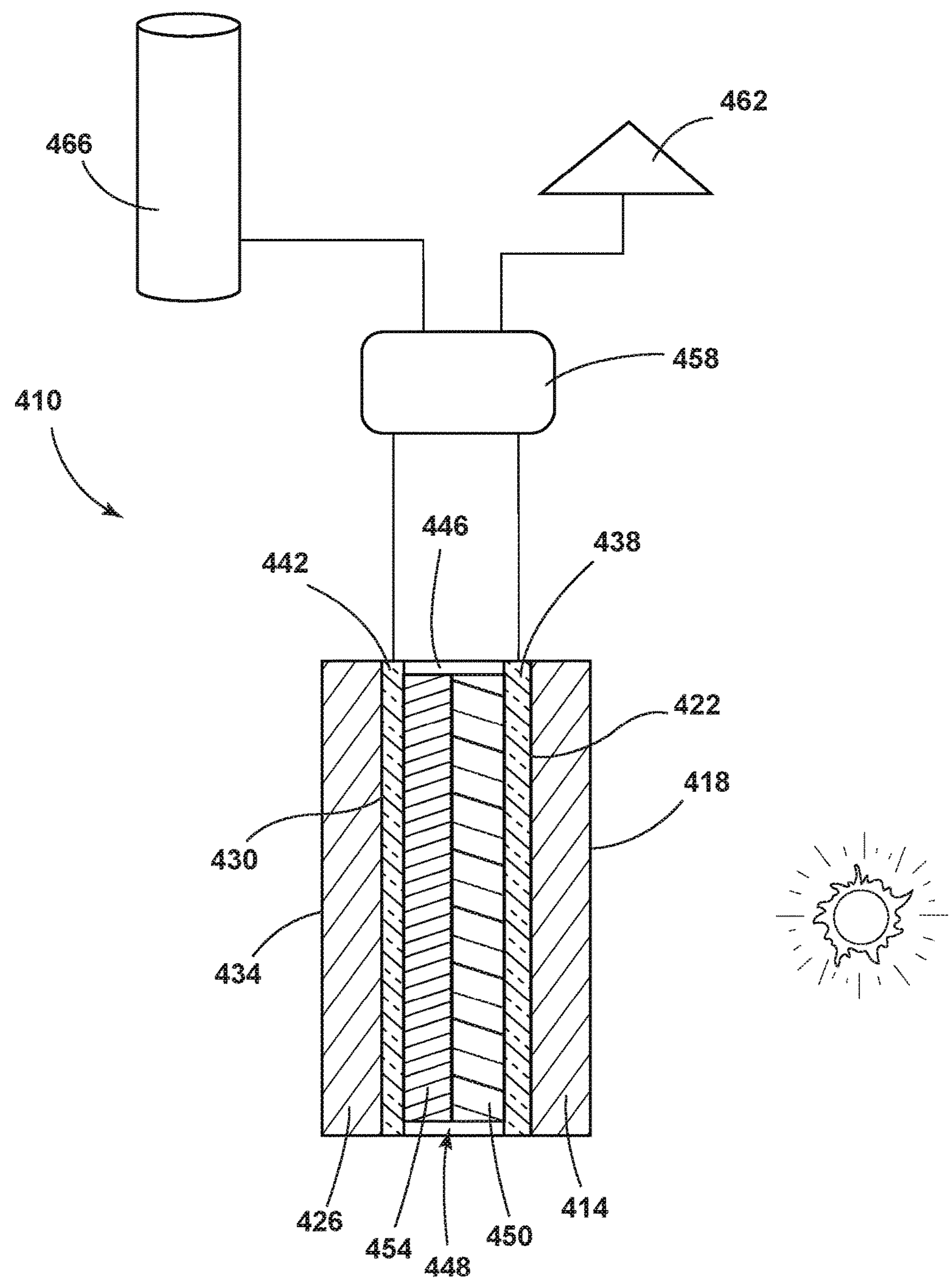
FIG. 5 is a schematic view of an electro-optic device in accordance with another aspect of the present disclosure.

Referring now to FIG. 5, an electro-optic device 410 includes a first substantially transparent substrate 414 having first and second surfaces 418, 422, disposed on opposite sides thereof, wherein the second surface 422 comprises a first electrically conductive layer 438, a second substantially transparent substrate 426 having third and fourth surfaces 430, 434 disposed on opposite sides thereof, wherein the third surface 430 comprises a second electrically conductive layer 442, and a primary seal 446 disposed between the first and second substantially transparent substrates 414, 426, wherein the seal 446 and the first and second substantially transparent substrates 414, 426 define a cavity 448 therebetween. The electro-optic device 410 further includes an electro-optic medium 454 disposed in the cavity 448 on the second electrically conductive layer 442, the electro-optic medium 454 being variably transmissive such that the electro-optic device 410 is operable between substantially clear and darkened states. A transparent photovoltaic medium 450 is disposed in the cavity 448 on the first electrically conductive layer 438, wherein the transparent photovoltaic medium converts and maintains the electro-optic device 410 to the darkened state, wherein the transparent photovoltaic medium 450 is additionally disposed on the electro-optic medium 454.

Still referring to the embodiments of FIG. 5, the second electrically conductive layer 144 (shown in FIG. 2) positioned between the transparent photovoltaic and electro-optic mediums 450, 454 may be eliminated and the transparent photovoltaic medium 450 may be directly coupled to the electro-optic medium 454 to function as the donor or acceptor material. The surface of the transparent photovoltaic medium 450 will be the electrode for the electro-optic medium 454. In this embodiments, the need for an electrical bus system on the electrode comprising the transparent photovoltaic medium 450 may be eliminated. The opposite electrode will benefit from a bus system to distribute the potential across the device. Wires may be needed to connect one side of the transparent photovoltaic medium 450 to the opposite electrode bus system. An external wiring system may also be used to disconnect the transparent photovoltaic medium 450 from the electro-optic medium 454 to allow for shorting the electro-optic device 410 to enable clearing. In this configuration, the electro-optic device 410 may also have an external power supply 466 to power the electro-optic device 410 when no light is available. In some aspects, the transparent photovoltaic medium 450 may be configured to electrically charge the external power supply 466.

In some embodiments, a controller 458 is configured to determine when power provided by the transparent photovoltaic medium 450 is sufficient to darken the electro-optic medium 454. In additional embodiments, one or more inputs 462 including, for example, optical sensors, temperature sensors, etc., may be in communication with the controller 458. The controller 458 receives input/information from the one or more inputs 462 and is configured to determine whether the power sources used to provide a voltage to the electro-optic medium 454 should be provided from the transparent photovoltaic medium 450 and/or the external power supply 466. The external power supply 466 includes, but is not limited to, a capacitor, a super capacitor and/or a rechargeable battery. The external power supply 466 is electrically coupled to the controller 458 and the one or more inputs 462, and is configured to power the same. It should be appreciated that more than one external power supply 466 may be implemented in the electro-optic device 410. The external power supply 466 is configured to store and/or deliver an electrical charge when the electro-optic device 410 is not absorbing the threshold light energy.

Figure 6:
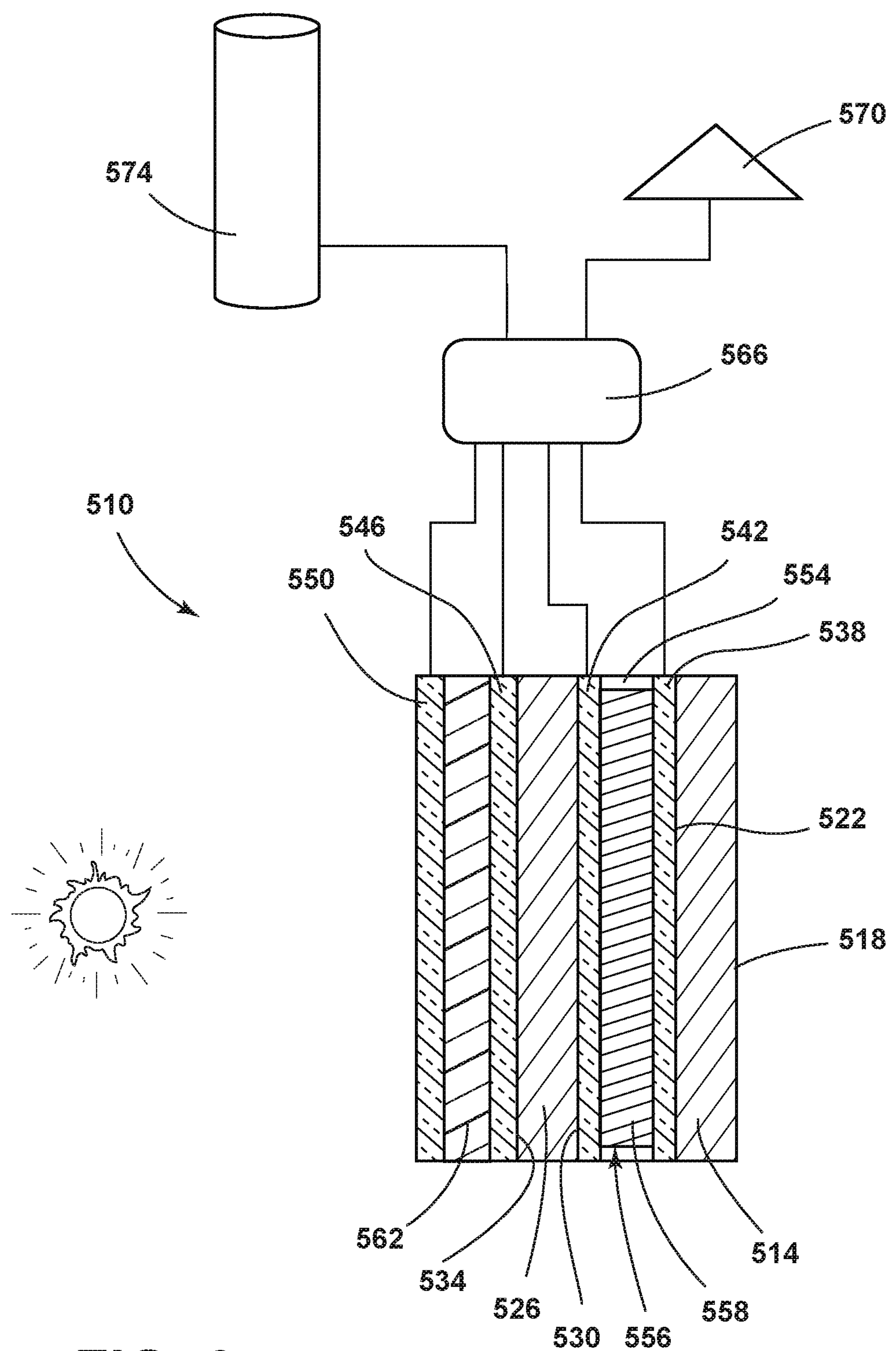
FIG. 6 is a schematic view of an electro-optic device in accordance with another aspect of the present disclosure.

Referring now to FIG. 6, an electro-optic device 510 includes a first substantially transparent substrate 526 having first and second surfaces 534, 530 disposed on opposite sides thereof, wherein the first surface 534 comprises a second electrically conductive layer 546 and the second surface 530 comprises a third electrically conductive layer 542, a second substantially transparent substrate 514 having third and fourth surfaces 522, 518 disposed on opposite sides thereof, wherein the third surface 522 comprises a fourth electrically conductive layer 538, and a primary seal 554 disposed between the first and second substantially transparent substrates, 526, 514 wherein the seal 554 and the first and second substantially transparent substrates 526, 514 define a cavity 556 therebetween. The electro-optic device 510 further includes an electro-optic medium 558 disposed in the cavity 556, the electro-optic medium 558 being variably transmissive such that the electro-optic device 510 is operable between substantially clear and darkened states and a transparent photovoltaic medium 562 disposed between a first electrically conductive layer 550 and the second electrically conductive layer 546 of the first substantially transparent substrate 526, wherein the transparent photovoltaic medium 562 converts and maintains the electro-optic device 510 to the darkened state. In this configuration, the electro-optic device 510 may also have an external power supply 574 to power the electro-optic device 510 when no light is available.

In some embodiments, a controller 566 is configured to determine when power provided by the transparent photovoltaic medium 562 is sufficient to darken the electro-optic medium 558. In additional embodiments, one or more inputs 570 including, for example, optical sensors, temperature sensors, etc., may be in communication with the controller 566. The controller 566 receives input/information from the one or more inputs 570 and is configured to determine whether the power sources used to provide a voltage to the electro-optic medium 558 should be provided from the transparent photovoltaic medium 562 and/or the external power supply 574. The external power supply 574 includes, but is not limited to, a capacitor, a super capacitor, and/or a rechargeable battery. The external power supply 574 is electrically coupled to the controller 566 and the one or more inputs 570, and is configured to power the same. It should be appreciated that more than one external power supply 574 may be implemented in the electro-optic device 510. The external power supply 574 is configured to store and/or deliver an electrical charge when the electro-optic device 510 is not absorbing the threshold light energy. In some aspects, the transparent photovoltaic medium 562 may be configured to electrically charge the external power supply 574.

In the illustrated embodiments, the electro-optic devices 10, 110, 210, 310, 410, 510 include the transparent photovoltaic medium (e.g. solar cell) for converting electromagnetic radiation into electrical power. The transparent photovoltaic medium may be constructed from a variety of materials such as, but not limited to, cadmium telluride (CdTe), silicon (Si), gallium arsenide (GaAs), and copper indium gallium selenide (CIGS) or a transparent photovoltaic cell such as, but not limited to, a heterojunction organic photovoltaic (OPV) cell, demonstrating peak-absorption in the ultraviolet (UV and/or near-infrared (NIR)). In one embodiment, an OPV cell could be deposited on a portion of the viewable electro-optic device and/or window area or its entirety.

In each of the embodiments disclosed herein, if the electro-optic device 10, 110, 210, 310, 410, 510 is large and the electrically conductive layer's conductivity is insufficient to provide for uniform coloring of a dimming device, it is advantageous to increase the potential of the transparent photovoltaic medium as a function of distance from the center of the electro-optic device. For example, when the transparent photovoltaic medium has uniform potential across a dimming device with no current flowing, the potential everywhere across the surface might be 0.7 volts. As current begins to flow, there is resistance in the electrically conductive layer that causes a potential drop at locations further from an electrical bus. The center may now have a potential of 0.5 volts compared to 0.7 volts near an electrical buss. If the transparent photovoltaic medium was non-uniform across the dimming device, the potential may be 0.9 volts near the center, 0.7 volts near an edge with no current, and 0.7 volts across the entire device with current draw. The potential drop is a function of the coatings and the current draw. In some embodiments, the potential gradient of the transparent photovoltaic medium may counteract the drop in electrical potential of the functioning electro-optic device 10, 110, 210, 310, 410, 510.

In some embodiments, the transparent photovoltaic medium may not be color neutral due to visible light absorbance or reflectance. It is possible to provide a complimentary color in the substrate, the lamination, some of the coatings, or in the electro-optic medium to balance the color of the transparent photovoltaic medium and provide a neutral color appearance. In one example the transparent photovoltaic medium's transmitted color appears blue. The electro-optic medium can be formulated to absorb the blue so the overall transmitted color appears neutral. This approach will reduce the overall transmittance of the device.

There are a number of wiring configurations (not shown) where in each of the embodiments described herein, the transparent photovoltaic mediums may be connected directly to the electro-optic device 10, 110, 210, 310, 410, 510 or each transparent photovoltaic medium may be used to charge an electrical storage device for later use. Control of the electro-optic device 10, 110, 210, 310, 410, 510 can range from no control (the device darkens whenever light available to activate the transparent photovoltaic medium) to limited control for clearing the device, to control using battery or other electrical power storage device.

Typically, the electro-optic device 10, 110, 210, 310, 410, 510 changes transmission states between a substantially clear state and a substantially dark or darkened state, as well as intermediate states thereto. The darkened state of the electro-optic device 10, 110, 210, 310, 410, 510 is defined relative to the transmissivity of the substantially clear state. Typical transmissivity of the electro-optic device 10, 110, 210, 310, 410, 510 in the substantially clear state is greater than about 50%, greater than about 55%, and above about 60%. Typical transmissivity of the electro-optic device 10, 110, 210, 310, 410, 510 in the substantially darkened state is less than about 1%, less than about 0.1%, and less than about 0.001%. An emissive display system can be configured such that the electro-optic device 10, 110, 210, 310, 410, 510 is in the darkened state when the transparent photovoltaic medium is in an ON condition and absorbing light. In this way, the electro-optic device 10, 110, 210, 310, 410, 510 defines a substantially dark background to enhance the viewing of the display. Conversely, the electro-optic device 10, 110, 210, 310, 410, 510 can be in the substantially clear state when the transparent photovoltaic medium is in an OFF condition, or not absorbing light, so that the emissive display system defines a substantially transparent window. Thus, when emissive display system is in the transparent window state it may function as a window of a house, office, automobile, airplane, or other vehicles and structures.

According to each of the embodiments described herein, the electro-optic medium 68, 152, 258, 358, 454, 558 is an electrochromic medium. The electrochromic medium can comprise at least one solvent, at least one anodic material, and at least one cathodic material. Typically, both of the anodic and cathodic materials are electroactive and at least one of them is electrochromic. The term "electroactive" can be a material that undergoes a modification in its oxidation state upon exposure to a particular electrical potential difference, and/or the term "electrochromic" can be a material that exhibits a change in its extinction coefficient at one or more wavelengths upon exposure to a particular electrical potential difference, according to one or more embodiments.

The electrochromic medium can be one of the following categories:

(I) Single-layer, single-phase—The electrochromic medium may comprise a single-layer of material which may include small non-homogenous regions, and include solution-phase devices where a material may be contained in solution in an ionically conducting electrolyte which remains in solution in the electrolyte when electrochemically oxidized or reduced. Solution-phase electroactive materials may be contained in the continuous solution-phase of a gel medium in accordance with the teachings of U.S. Pat. No. 5,928,572, entitled "Electrochromic Layer And Devices Comprising Same," and International Patent Application Serial No. PCT/US98/05570, entitled "Electrochromic Polymeric Solid Films, Manufacturing Electrochromic Devices Using Such Solid Films, And Processes For Making Such Solid Films And Devices," both of which are hereby incorporated herein by reference in their entirety including all references incorporated and/or cited therein.

More than one anodic and cathodic material can be combined to give a pre-selected color as described in U.S. Pat. No. 5,998,617, entitled "Electrochromic Compounds," U.S. Pat. No. 6,020,987, entitled "Electrochromic Medium Capable Of Producing A Pre-selected Color," U.S. Pat. No. 6,037,471, entitled "Electrochromic Compounds," and U.S. Pat. No. 6,141,137, entitled "Electrochromic Media For Producing A Pre-selected Color," all of which are hereby incorporated herein by reference in their entirety including all references incorporated and/or cited therein.

The anodic and cathodic materials may also be combined or linked by a bridging unit as described in U.S. Pat. No. 6,241,916, entitled "Electrochromic System," and/or U.S. Patent Publication No. 2002/0015214A1, now U.S. Pat. No. 6,519,072, entitled "Electrochromic Device," which are hereby incorporated herein by reference in their entirety including all references incorporated and/or cited therein. The electrochromic materials may also include near-infrared (NIR) absorbing compounds as described in U.S. Pat. No. 6,193,912, entitled "Near Infrared-Absorbing Electrochromic Compounds And Devices Comprising Same," which is hereby incorporated herein by reference in its entirety including all references incorporated and/or cited therein.

It is also possible to link anodic materials or cathodic materials by similar methods. The concepts described in these patents can further be combined to yield a variety of electroactive materials that are linked or coupled, including linking of a redox buffer, such as linking of a color-stabilizing moiety, to an anodic and/or cathodic material.

The anodic and cathodic electrochromic materials can also include coupled materials as described in U.S. Pat. No. 6,249,369, entitled "Coupled Electrochromic Compounds With Photostable Dication Oxidation States," which is hereby incorporated herein by reference in its entirety including all references incorporated and/or cited therein.

The concentration of the electrochromic materials can be selected as taught in U.S. Pat. No. 6,137,620, entitled "Electrochromic Media With Concentration Enhanced Stability, Process For The Preparation Thereof and Use In Electrochromic Devices," which is hereby incorporated herein by reference in its entirety including all references incorporated and/or cited therein.

Additionally, a single-layer, single-phase medium may include a medium where the anodic and cathodic materials are incorporated into a polymer matrix as is described in International Patent Application Serial No. PCT/EP98/03862, entitled "Electrochromic Polymer System," and International Patent Application Serial No. PCT/US98/05570, entitled "Electrochromic Polymeric Solid Films, Manufacturing Electrochromic Devices Using Such Solid Films, And Processes For Making Such Solid Films And Devices," which are hereby incorporated herein by reference in its entirety including all references incorporated and/or cited therein.

(II) Multi-layer—The electrochromic medium may also be prepared in layers and include a material attached directly to an electrically conducting electrode or confined in close proximity thereto which remains attached or confined when electrochemically oxidized or reduced.

(III) Multi-phase—The electrochromic medium may further be prepared using multiple phases where one or more materials in the medium undergoes a change in phase during the operation of the device. For example, a material contained in solution in the ionically conducting electrolyte forms a layer on the electrically conducting electrode when electrochemically oxidized or reduced.

The electro-optic device as described herein may be used in many different types of devices that include, for example, a mirror, mirror assemblies, a vehicle rearview assembly, a window, a display device, an aircraft transparency, or combinations thereof.

It will be understood by one having ordinary skill in the art that construction of the described device and other components is not limited to any specific material. Other exemplary embodiments of the device disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the device as shown in the exemplary embodiments is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present device. The exemplary structures and processes disclosed herein are for illustrative purposes and are not to be construed as limiting.

It is also to be understood that variations and modifications can be made on the aforementioned structures and methods without departing from the concepts of the present device, and further it is to be understood that such concepts are intended to be covered by the following claims unless these claims by their language expressly state otherwise.

The above description is considered that of the illustrated embodiments only. Modifications of the device will occur to those skilled in the art and to those who make or use the device. Therefore, it is understood that the embodiments shown in the drawings and described above is merely for illustrative purposes and not intended to limit the scope of the device, which is defined by the following claims as interpreted according to the principles of patent law, including the Doctrine of Equivalents.

Listing of Non-Limiting Embodiments

Embodiment A is an electro-optic device comprising a first substantially transparent substrate having first and second surfaces disposed on opposite sides thereof, wherein the second surface comprises a first electrically conductive layer; a second substantially transparent substrate having third and fourth surfaces disposed on opposite sides thereof, wherein the third surface comprises a second electrically conductive layer; a primary seal disposed between the first and second substantially transparent substrates, wherein the seal and the first and second substantially transparent substrates define a cavity therebetween; an electro-optic medium disposed in the cavity on the second electrically conductive layer, the electro-optic medium being variably transmissive such that the electro-optic device is operable between substantially clear and darkened states; and a transparent photovoltaic medium disposed in the cavity on the first electrically conductive layer, wherein the transparent photovoltaic medium converts and maintains the electro-optic device to the darkened state, wherein the transparent photovoltaic medium is additionally disposed on the electro-optic medium.

The elector-optic device of Embodiment A further comprising a controller electrically coupled to the first and second electrically conductive layers.

The electro-optic device of Embodiment A or Embodiment A with any of the intervening features wherein the controller is electrically coupled to one or more inputs and an energy storage device.

The electro-optic device of Embodiment A or Embodiment A with any of the intervening features further comprising an external power supply configured to store and deliver an electrical charge when the transparent photovoltaic medium is not absorbing a threshold light energy.

The electro-optic device of Embodiment A or Embodiment A with any of the intervening features wherein the transparent photovoltaic medium is configured to electrically charge an external power supply.

The electro-optic device of Embodiment A or Embodiment A with any of the intervening features wherein the transparent photovoltaic medium has at least a 45% visible light transmission.

The electro-optic device of Embodiment A or Embodiment A with any of the intervening features wherein the electro-optic device is selected from the group consisting of a mirror, a vehicle rearview assembly, a window, a display device, an aircraft transparency.

The electro-optic device of Embodiment A or Embodiment A with any of the intervening features further comprising a third electrically conductive layer disposed between the electro-optic medium and the transparent photovoltaic medium.

The electro-optic device of Embodiment A or Embodiment A with any of the intervening features wherein one or more inputs send information to a controller configured to direct a voltage to the electro-optic device through the transparent photovoltaic medium or an external power supply.

Embodiment B is an electro-optic device comprising a first substantially transparent substrate having first and second surfaces disposed on opposite sides thereof, wherein the second surface comprises a first electrically conductive layer; a second substantially transparent substrate having third and fourth surfaces disposed on opposite sides thereof, wherein the third surface comprises a third electrically conductive layer; a primary seal disposed between the first and second substantially transparent substrates, wherein the seal and the first and second substantially transparent substrates define a cavity therebetween; an electro-optic medium disposed in the cavity on the third surface of the second substantially transparent substrate, the electro-optic medium being variably transmissive such that the electro-optic device is operable between substantially clear and darkened states; a transparent photovoltaic medium disposed in the cavity on the first electrically conductive layer, wherein the transparent photovoltaic medium converts and maintains the electro-optic device to the darkened state; and a second electrically conductive layer disposed between the electro-optic medium and the transparent photovoltaic medium.

The electro-optic device of Embodiment B further comprising a controller coupled to the first, second, and third electrically conductive layers, wherein the controller is coupled to one or more inputs and an energy storage device.

The electro-optic device of Embodiment B or Embodiment B with any of the intervening features further comprising an external power supply configured to store and deliver an electrical charge when the transparent photovoltaic medium is not absorbing a threshold light energy.

The electro-optic device of Embodiment B or Embodiment B with any of the intervening features wherein one or more inputs send information to a controller configured to direct a voltage to the electro-optic device through the transparent photovoltaic medium or an external power supply.

The electro-optic device of Embodiment B or Embodiment B with any of the intervening features wherein the transparent photovoltaic medium is configured to electrically charge an external power supply.

The electro-optic device of Embodiment B or Embodiment B with any of the intervening features wherein the transparent photovoltaic medium has at least a 45% visible light transmission.

The electro-optic device of Embodiment B or Embodiment B with any of the intervening features wherein the electro-optic device is selected from the group consisting of a mirror, a vehicle rearview assembly, a window, a display device, an aircraft transparency.

Embodiment C is an electro-optic device comprising a first substantially transparent substrate having first and second surfaces disposed on opposite sides thereof, wherein the first surface comprises a second electrically conductive layer and the second surface comprises a third electrically conductive layer; a second substantially transparent substrate having third and fourth surfaces disposed on opposite sides thereof, wherein the third surface comprises a fourth electrically conductive layer; a primary seal disposed between the first and second substantially transparent substrates, wherein the seal and the first and second substantially transparent substrates define a cavity therebetween; an electro-optic medium disposed in the cavity, the electro-optic medium being variably transmissive such that the electro-optic device is operable between substantially clear and darkened states; and a transparent photovoltaic medium disposed between a first electrically conductive layer and the second electrically conductive layer of the first substantially transparent substrate, wherein the transparent photovoltaic medium converts and maintains the electro-optic device to the darkened state.

The electro-optic device of Embodiment C further comprising a controller coupled to the first, second, third, and fourth electrically conductive layers, and wherein the controller is coupled to one or more inputs and an energy storage device.

The electro-optic device of Embodiment C or Embodiment C with any of the intervening features further comprising an external power supply configured to store and deliver an electrical charge when the transparent photovoltaic medium is not absorbing a threshold light energy.

The electro-optic device of Embodiment C or Embodiment C with any of the intervening features wherein one or more inputs send information to a controller configured to direct a voltage to the electro-optic device through the transparent photovoltaic medium or an external power supply.

What is claimed is:

1. An electro-optic device comprising:

a first substantially transparent substrate having first and second surfaces disposed on opposite sides thereof, wherein the second surface comprises a first electrically conductive layer;

a second substantially transparent substrate having third and fourth surfaces disposed on opposite sides thereof, wherein the third surface comprises a second electrically conductive layer;

a primary seal disposed between the first and second substantially transparent substrates, wherein the seal and the first and second substantially transparent substrates define a cavity therebetween;

an electro-optic medium disposed in the cavity on the second electrically conductive layer, the electro-optic medium being variably transmissive such that the electro-optic device is operable between substantially clear and darkened states; and a transparent photovoltaic medium disposed in the cavity on the first electrically conductive layer, wherein the transparent photovoltaic medium converts and maintains the electro-optic device to the darkened state, wherein the transparent photovoltaic medium is additionally disposed on the electro-optic medium.

2. The electro-optic device of claim 1, further comprising:

a controller electrically coupled to the first and second electrically conductive layers.

3. The electro-optic device of claim 2, wherein the controller is electrically coupled to one or more inputs and an energy storage device.

4. The electro-optic device of claim 1, further comprising:

an external power supply configured to store and deliver an electrical charge when the transparent photovoltaic medium is not absorbing a threshold light energy.

5. The electro-optic device of claim 1, wherein the transparent photovoltaic medium is configured to electrically charge an external power supply.

6. The electro-optic device of claim 1, wherein the transparent photovoltaic medium has at least a 45% visible light transmission.

7. The electro-optic device of claim 1, wherein the electro-optic device is selected from the group consisting of a mirror, a vehicle rearview assembly, a window, a display device, an aircraft transparency.

8. The electro-optic device of claim 1, further comprising:

a third electrically conductive layer disposed between the electro-optic medium and the transparent photovoltaic medium.

9. The electro-optic device of claim 1, wherein one or more inputs send information to a controller configured to direct a voltage to the electro-optic device through the transparent photovoltaic medium or an external power supply.

10. An electro-optic device comprising:

a first substantially transparent substrate having first and second surfaces disposed on opposite sides thereof, wherein the second surface comprises a first electrically conductive layer;

a second substantially transparent substrate having third and fourth surfaces disposed on opposite sides thereof, wherein the third surface comprises a third electrically conductive layer;

a primary seal disposed between the first and second substantially transparent substrates, wherein the seal and the first and second substantially transparent substrates define a cavity therebetween;

an electro-optic medium disposed in the cavity on the third surface of the second substantially transparent substrate, the electro-optic medium being variably transmissive such that the electro-optic device is operable between substantially clear and darkened states;

a transparent photovoltaic medium disposed in the cavity on the first electrically conductive layer, wherein the transparent photovoltaic medium converts and maintains the electro-optic device to the darkened state; and a second electrically conductive layer disposed between the electro-optic medium and the transparent photovoltaic medium.

11. The electro-optic device of claim 10, further comprising a controller coupled to the first, second, and third electrically conductive layers, wherein the controller is coupled to one or more inputs and an energy storage device.

12. The electro-optic device of claim 10, further comprising an external power supply configured to store and deliver an electrical charge when the transparent photovoltaic medium is not absorbing a threshold light energy.

13. The electro-optic device of claim 10, wherein one or more inputs send information to a controller configured to direct a voltage to the electro-optic device through the transparent photovoltaic medium or an external power supply.

14. The electro-optic device of claim 10, wherein the transparent photovoltaic medium is configured to electrically charge an external power supply.

15. The electro-optic device of claim 10, wherein the transparent photovoltaic medium has at least a 45% visible light transmission.

16. The electro-optic device of claim 10, wherein the electro-optic device is selected from the group consisting of a mirror, a vehicle rearview assembly, a window, a display device, an aircraft transparency.

17. An electro-optic device comprising:

a first substantially transparent substrate having first and second surfaces disposed on opposite sides thereof, wherein the first surface comprises a second electrically conductive layer and the second surface comprises a third electrically conductive layer;

a second substantially transparent substrate having third and fourth surfaces disposed on opposite sides thereof, wherein the third surface comprises a fourth electrically conductive layer;

a primary seal disposed between the first and second substantially transparent substrates, wherein the seal and the first and second substantially transparent substrates define a cavity therebetween;

an electro-optic medium disposed in the cavity, the electro-optic medium being variably transmissive such that the electro-optic device is operable between substantially clear and darkened states; and a transparent photovoltaic medium disposed between a first electrically conductive layer and the second electrically conductive layer of the first substantially transparent substrate, wherein the transparent photovoltaic medium converts and maintains the electro-optic device to the darkened state.

18. The electro-optic device of claim 17, further comprising a controller coupled to the first, second, third, and fourth electrically conductive layers, and wherein the controller is coupled to one or more inputs and an energy storage device.

19. The electro-optic device of claim 17, further comprising an external power supply configured to store and deliver an electrical charge when the transparent photovoltaic medium is not absorbing a threshold light energy.

20. The electro-optic device of claim 17, wherein one or more inputs send information to a controller configured to direct a voltage to the electro-optic device through the transparent photovoltaic medium or an external power supply.

* * * * *